United States Patent

Kimura

[11] Patent Number: 5,602,509
[45] Date of Patent: Feb. 11, 1997

[54] MOS OPERATIONAL TRANSCONDUCTANCE AMPLIFIER USING AN ADAPTIVELY-BIASED DIFFERENTIAL PAIR

[75] Inventor: Katsuji Kimura, Tokyo, Japan

[73] Assignee: NEC Corporation, Tokyo, Japan

[21] Appl. No.: 488,779

[22] Filed: Jun. 8, 1995

[30] Foreign Application Priority Data

Jun. 9, 1994 [JP] Japan .................................. 6-127887

[51] Int. Cl.$^6$ ...................................................... H03F 3/45
[52] U.S. Cl. .......................... 330/253; 330/257; 330/261
[58] Field of Search ..................................... 330/253, 257, 330/258, 261

[56] References Cited

U.S. PATENT DOCUMENTS 5,381,113   1/1995   Kimura ................................... 330/253

FOREIGN PATENT DOCUMENTS 0597420   5/1994   European Pat. Off. .
0608886   8/1994   European Pat. Off. .

OTHER PUBLICATIONS

K. Kimura, "An MOS Operational Transconductance Amplifier and an MOS Four-Quadrant Analog Multiplier Using the Quadritail Cell", Dec. 12, 1992, IEICE Trans. Fundamentals, 1774–1776, vol. E75–A.

A. Nedungadi et al., "Design of Linear CMOS Transconductance Elements", IEEE Transactions on Circuits and Systems, vol. CAS–31, No. 10, Oct. 1984, pp. 891–894.

Primary Examiner—James B. Mullins
Attorney, Agent, or Firm—Young & Thompson

[57] ABSTRACT

An MOS OTA that enables to provide superior transconductance linearity within a wider input voltage range without increase in circuit scale and to be formed on a semiconductor integrated circuit device. The MOS OTA includes a differential pair of first and second MOSFETs whose sources are coupled together, and a quadritail circuit for driving the differential pair by its output signal having a square-law characteristic. The quadritail circuit contains a first transistor pair of third and fourth MOSFETs, a second transistor pair of fifth and sixth MOSFETs, and a constant current source or sink for driving the first and second transistor pairs. Gates of the third and fourth MOSFETs are applied with the differential input signal. Gates of the fifth and sixth MOSFETs are coupled together to be applied with a dc voltage of the differential input signal. The transconductance nonlinearity of the differential pair is compensated by the output current of the quadritail circuit.

9 Claims, 7 Drawing Sheets

MOS OPERATIONAL TRANSCONDUCTANCE AMPLIFIER USING AN ADAPTIVELY-BIASED DIFFERENTIAL PAIR

BACKGROUND OF THE INVENTION

1. Field of the Invention

The present invention relates to a differential amplifier circuit for amplifying analog signals and more particularly, to an adaptively-biased differential amplifier circuit capable of linear behavior, which provides a superior transconductance linearity within a wide input voltage range and which is formed on a metal-oxide-semiconductor (MOS) integrated circuit device.

2. Description of the Prior Art

An adaptively-biased differential amplifier circuit for amplifying analog signals having superior transconductance linearity within a comparatively wide input voltage range is known as an "operational transconductance amplifier (OTA)". If the operational transconductance amplifier is comprised of MOS field-effect transistors (MOSFETs), it is termed an "MOS OTA".

With a source-coupled differential pair of first and second MOSFETs driven by a tail current, drain currents of the MOSFETs are expressed as follows.

Here, we assume that all the MOSFETs are operating in the saturation region, the characteristics of the MOSFETs are matched, and the channel-length modulation and the body effect can be ignored- Then, the drain currents $I_{Di}$ of the i-th MOSFETs are expressed by the following equations (1a) and (1b), where $\beta$ is the transconductance parameter, $V_{GSi}$ are the gate-to-source voltages of the i-th MOSFETs, and $V_{TH}$ is the threshold voltage thereof.

$$I_{Di} = \beta(V_{GSi} - V_{Th})^2 \quad (V_{GSi} V_{Th}) \tag{1a}$$

$$I_{Di} = 0 \quad (V_{GSi} V_{TH}) \tag{1b}$$

The transconductance parameter $\beta$ is expressed as $$\beta = (1/2)(W/L)\mu C_{ox},$$

where $\mu$ is the effective surface carrier mobility, $C_{ox}$ is a gate-oxide capacity per unit area, and W and L are a gate width and a gate length of each MOSFET, respectively.

The equation (1a) is obtained by approximation to Schockley's equation.

If the tail current is defined as $I_{sa}$ and a differential input voltage is defined as $V_i$, a differential output current $\Delta I$ of the MOS differential pair is expressed as the following equations (2a) and (2b).

$$\Delta I = \beta V_i \sqrt{\frac{2I_{SS}}{\beta} - V_i^2} \quad \left(|V_i| \leq \sqrt{\frac{I_{SS}}{\beta}}\right) \tag{2a}$$

$$\Delta I = I_{SS}\operatorname{sgn}(V_i) \quad \left(|V_i| \geq \sqrt{\frac{I_{SS}}{\beta}}\right) \tag{2b}$$

The transconductance of the MOS differential pair is obtained by differentiating the equations (2a) and (2b) by the differential input voltage $v_i$.

It is seen from the equation (2a) that the transconductance nonlinearity of the differential pair can be compensated perfectly if the tail current $I_{ss}$ has a square-law characteristic of the input voltage $V_i$ that satisfies the following relationship (3).

$$I_{SS} = I_0 + \frac{1}{2}\beta V_i^2 \tag{3}$$

When substituting the equation (3) into the equation (2a), the differential output current $\Delta I$ is proportional to the input voltage $V_i$, i.e, $\Delta I = (2I_0\beta)^{1/2} \cdot V_i$. Therefore, the transconductance becomes constant, i.e., $d(\Delta I)/dV_i = (2I_0\beta)^{1/2}$, within the input voltage range of $|V_i| \leq (I_{ss}/\beta)^{1/2}$.

FIG. 3 shows a functional block diagram of such adaptively-biased differential pair. In FIG. 3, a differential pair 1 is formed by two MOSFETs M1 and M2. Gates of the MOSFETs M1 and M2 are applied with the input voltage $V_i$. A squaring circuit 2 for squaring the input voltage $V_i$ drives the differential pair 1 by its output current, i.e., the tail current $I_{ss}$ for the pair 1. The differential output current $\Delta I$ of the differential pair is derived through an active load 3.

FIG. 4 shows the transconductance characteristics of the adaptively-biased differential pair and a differential pair with a constant tail current. As shown in FIG. 4, the transconductance linearity is compensated by the squaring circuit 2.

The conventional MOS OTA was first disclosed by A. Nedungadi and T. R. Viswanathan in IEEE TRANSACTIONS ON CIRCUITS AND SYSTEMS, Vol. CAS-31, No. 10, pp. 891–894, October 1984, entitled "Design of Linear CMOS transconductance Elements", which contains an unbalanced, source-coupled quad cell as a squaring circuit.

The circuit configuration of this conventional MOS OTA is shown in FIG. 1. In FIG. 1, N-channel MOSFETs M51, M52, M53 and M54 compose a cross-coupled quad cell. The pair of the MOSFETs M51 and M54 is driven by a constant current (current: (n+1)I) connected to the common-connected sources of the MOSFETs M51 and M54. The pair of the MOSFETs M52 and M53 is driven by another constant current sink (current: (n+1)I) connected to the common-connected sources of the MOSFETs M52 and M53. The transconductance parameters of the MOSFETs M51 and M52 are $\beta$ and those of the MOSFETs M53 and M54 are n$\beta$.

N-channel MOSFETs M56 and M57 whose sources are connected in common at a node B compose a differential pair, which is driven by a constant current sink (current: aI). The transconductance parameters of the MOSFETs M56 and M57 are $\beta$.

The drains of the MOSFETs M51 and M52 are connected in common at a node A to be connected to another constant current source (current: aI). An N-channel MOSFET M55 whose drain and gate are connected to one another is provided between the nodes A and B. The MOSFET M55 and the current sink disposed near the node A serves as a current level shifter for shifting the current level at the node A to that at the node B.

The gates of the MOSFETs M56, M53 and M51 are connected in common to be applied with a first input voltage $V_1$. The gates of the MOSFETs M57, M54 and M52 are connected in common to be applied with a second input voltage $V_2$.

P-channel MOSFETs M58 and M59 compose a current mirror circuit serving as an active load of the differential pair. An output current i is derived from the drain of the MOSFET M59.

The characters $V^+$ and $V^-$ denote supply voltages, respectively.

An output current $I_L$ of the quad cell is expressed as the following equations (4a), (4b) and (4c).

$$I_L = aI - (I_{DS1} + I_{DS2}) \quad (4a)$$

$$= aI - \frac{2n}{(n+1)}I + 2\frac{n(n-1)}{(n+1)^2}\beta V_i^2$$

$$\left(|V_i| \leq \sqrt{\frac{(n+1)I}{n\beta}}\right)$$

$$I_L = aI - (I_{DS1} + I_{DS2}) \quad (4b)$$

$$= aI + \frac{(3n-1)}{2(n+1)}I +$$

$$\frac{n(n+1)\beta V_i^2 + 2n\beta |V_i| \sqrt{(n+1)^2\frac{I}{\beta} - nV_i^2}}{(n+1)^2}$$

$$\left(\sqrt{\frac{(n+1)I}{n\beta}} \leq |V_i| \leq \sqrt{\frac{(n+1)I}{\beta}}\right)$$

$$I_L = aI(I_{DS1} + I_{DS2}) \quad (4c)$$

$$= aI \left(|V_i| \geq \sqrt{\frac{(n+1)I}{\beta}}\right)$$

where $I_{DS1}$ and $I_{DS2}$ are drain currents of the MOSFETs M51 and M52, respectively.

To make the bias current to the differential pair of MOSFETs M56 and M57 adaptive, the tail current $I_{ss}$ should be satisfy the following equation (5).

$$I_{SS} = aI - \frac{2n}{(n+1)}I + 2\frac{n(n-1)}{(n+1)^2}\beta V_i^2 = I_0 + \frac{1}{2}\beta V_i^2 \quad (5)$$

Then, the transconductance $g_m$ of the conventional MOS OTA becomes constant within the input voltage range of $$|V_i| \leq \{(n+1)I/(n\beta)\}^{1/2}, \text{ that is}$$

$$g_m = \{(a-2n/(n+1))(I/\beta)\}^{1/2}$$

Since the coefficients of $V_i$ in the equation (5) need to be equal to each other, the following relationship (6) needs to be satisfied.

$$2\frac{n(n-1)}{(n+1)^2} = \frac{1}{2} \quad (6)$$

Solving the relationship (6) for n provides the optimum value of n as $$n = 1 + \frac{2}{\sqrt{3}} \quad (\approx 2.1547) \quad (7)$$

Nedungadi et al disclosed the error characteristic of the transconductance linearity obtained by the SPICE simulation, where n=2, 2.1, 2.155, 2.2 and 2.3, as shown in FIG. 2. They described that the error was limited less than 0.1% in the case of n=2.155.

With the conventional MOS OTA of Nedungadi et al., to make the transconductance linear, one of the two MOSFETs forming each unbalanced pair needs to have a gate-width to the gate-length ratio (W/L) that is $(1+2/3^{1/2})$ ($\approx 2.1547$) times the ratio (W/L) Of the other thereof. However, such ratio is extremely difficult to be fabricated on a large-scale semiconductor integrated circuit device (LSI), which means that this MOS OTA is impossible to be practically realized.

If the ratio of $(1+2/3^{1/3})$ ($\approx 2.1547$) is rounded or approximated to an integer, no satisfactory transconductance linearity can be obtained.

Also, an obtainable input voltage range for the perfect linear transconductance is very narrow. The circuit scale is large because unbalanced source-coupled pairs are employed.

SUMMARY OF THE INVENTION

Accordingly, an object of the present invention is to provide an MOS OTA in which superior transconductance linearity can be obtained within a wider input voltage range than the case of the conventional one without increase circuit scale.

Another object of the present invention is to provide an MOS OTA that can be formed on a semiconductor integrated circuit device.

An MOS OTA according to the present invention includes a differential pair of first and second MOSFETs whose sources are coupled together, and a quadritail circuit for driving the differential pair by its output signal having a square-law characteristic.

A differential input signal is applied across gates of the first and second MOSFETs. A differential output signal is derived from drains of the first and second MOSFETs.

The quadritail circuit contains a first transistor pair of third and fourth MOSFETs, a second transistor pair of fifth and sixth MOSFETs, and a constant current source or sink for driving the first add second transistor pairs.

Sources of the third, fourth, fifth and sixth MOSFETs are coupled together to be connected to the constant current source or sink. Drains of the third end fourth MOSFETs of the first transistor pair are coupled together and drains of the fifth and sixth MOSFETs of the second transistor pair are coupled together. The output signal of the quadritail circuit is derived from one of the coupled drains of third and fourth MOSFETs and the coupled drains of the fifth and sixth MOSFETs.

Gates Of the third and fourth MOSFETs are applied with the differential input signal. Gates of the fifth and sixth MOSFETs are coupled together to be applied with a direct current (dc) voltage of the differential input signal.

With the MOS OTA according to the present invention, to compensate the nonlinearity in the transconductance of the differential pair, the quadritail circuit whose output current has a square-law characteristic is provided for driving the differential pair, and the gates of the third and fourth MOSFETs of the quadritail circuit are applied with the differential input signal and the gates of the fifth and sixth MOSFETs thereof are coupled together to be applied with the dc voltage level of the differential input signal.

As a result, a MOS OTA having a superior transconductors linearily within a wider input voltage range than the case of the conventional one can be realized without increase in circuit scale.

Since the capacities or gate-length to gate-width ratios (W/L) of the third to sixth MOSFETs forming the quadritail circuit are equal to each other, this MOS OTA can be formed on a semiconductor integrated circuit device.

DETAILED DESCRIPTION OF THE PREFERRED EMBODIMENTS

Figure 1:
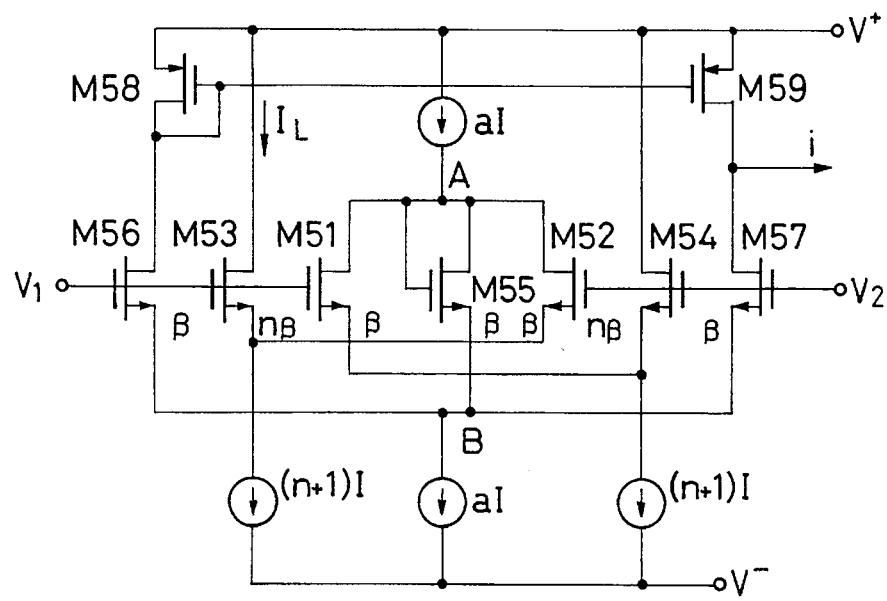
FIG. 1 is a circuit diagram of a conventional MOS OTA having an adaptively-biased differential pair.
Figure 2:
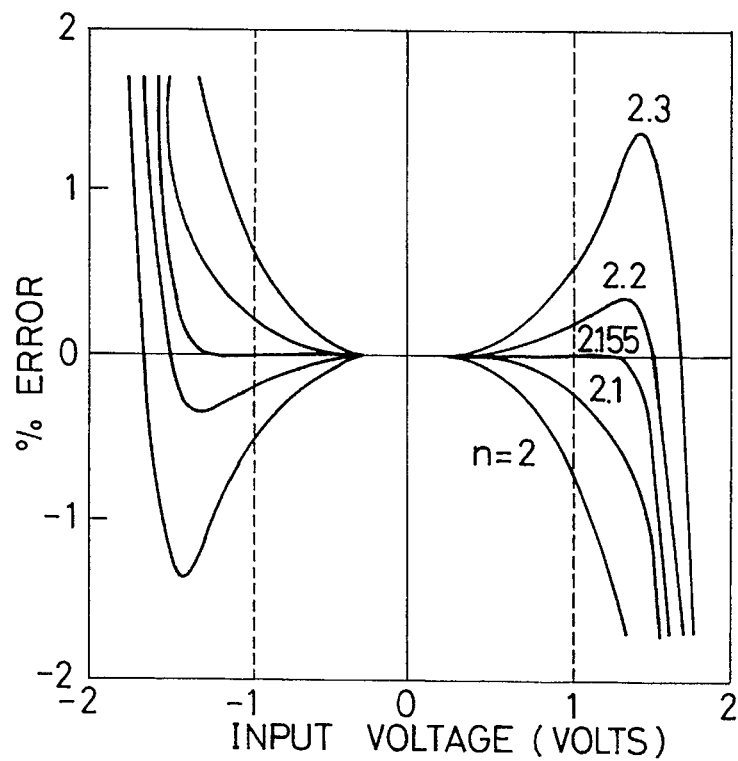
FIG. 2 shows an error characteristic of the transconductance linearity of the conventional MOS OTA of FIG. 1 as a function of the input voltage, which is obtained by a SPICE simulation with a parameter n.
Figure 3:
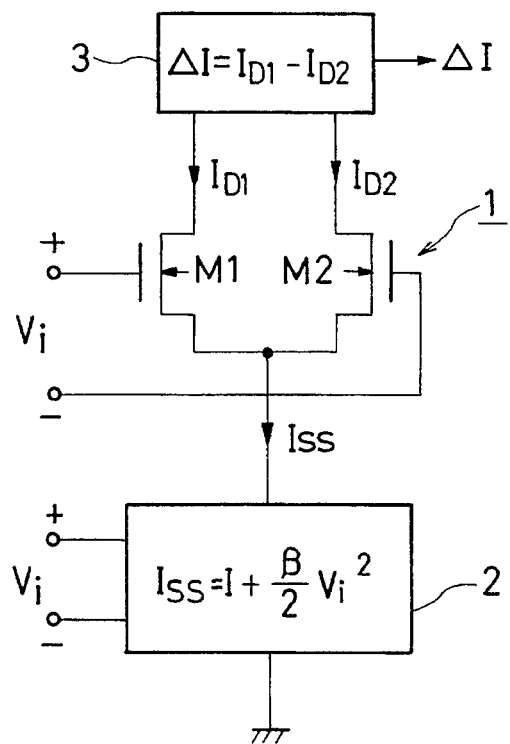
FIG. 3 is a functional block diagram of an MOS OTA having an adaptively-biased differential pair.
Figure 4:
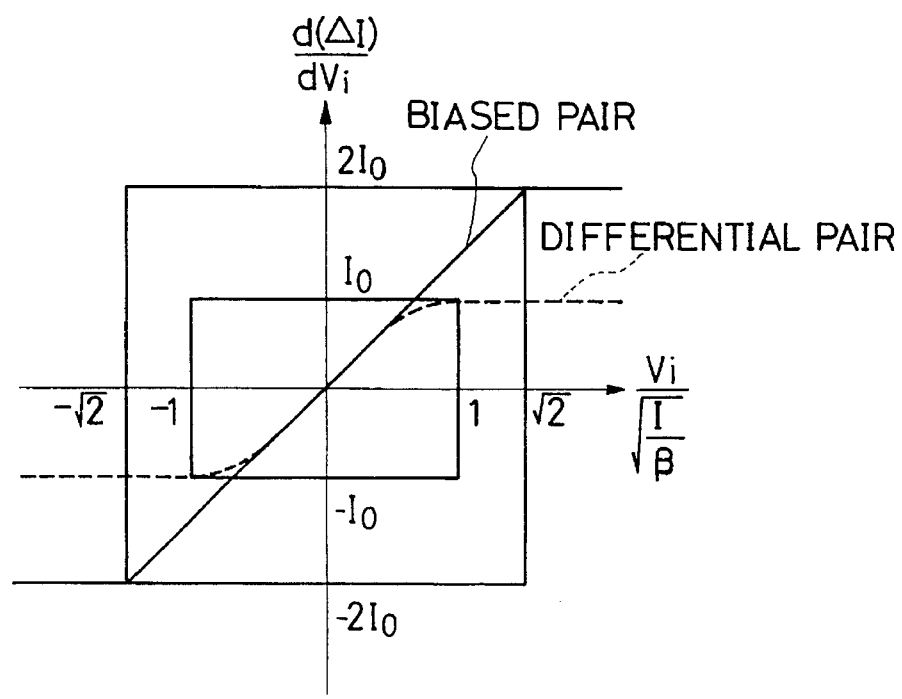
FIG. 4 shows trans conductance characteristics of an adaptively-biased MOS OTA and a source-coupled differential pair with a constant tail current.

Preferred embodiments of the present invention will be described below referring to the drawing figures attached.

FIRST EMBODIMENT

Figure 5:
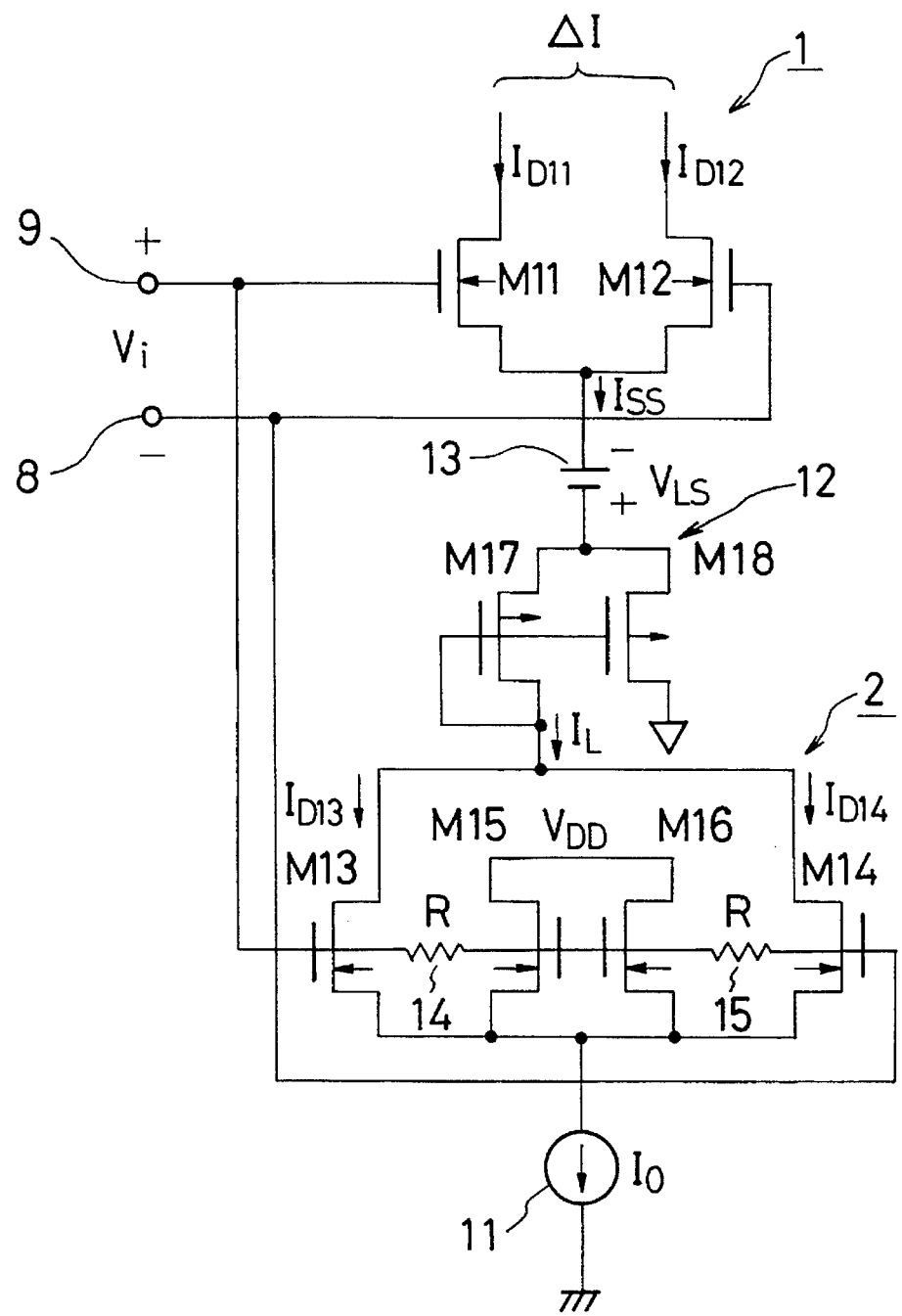
FIG. 5 is a circuit diagram of an adaptively-biased MOS OTA according to a first embodiment of the present invention.

As shown in FIG. 5, an adaptively-biased MOS OTA according to a first embodiment contains a balanced differential pair 1 formed of P-channel MOSFETs M11 and M12, and a quadritail circuit 2 formed of four P-channel MOSFETs M13, M14, M15 and M16 and a single constant current sink (current: $I_0$) for driving the quadritail circuit 2. The quadritail circuit 2 drives the differential pair 1 by its output current.

The MOSFETs M11 and M12 of the differential pair 1 have gate-width to gate-length ratios (W/L) equal to each other. Input ends of the differential pair 1, i.e., gates of the MOSFETs M11 and M12 are connected to a pair of input terminals 8 and 9 through which a differential input voltage $V_i$ is applied.

The MOSFETs M13 and M14 of the quadritail circuit 2 form a first balanced transistor pair and the MOSFETs M15 and M16 thereof form a second balanced transistor pair. Here, the MOSFETs M13, M14, M15 and M16 have gate-width to gate-length ratios (W/L) equal to each other.

Sources of the MOSFETs M13, M14, M15 and M16 are coupled together to be connected to the constant current sink 11. Drains of the MOSFETs M13 and M14 are coupled together. Drains of the MOSFETs M15 and M16 are also coupled together.

Input ends of the first transistor pair, i.e., gates of the MOSFETs M13 and M14 are connected to the pair of input terminals 9 and 8, respectively. Therefore, the gates of the MOSFETs M13 and M14 are applied with the differential input voltage $V_i$.

A resistor 14 having a resistance R is connected between the gates of the MOSFETs M13 and M15. Another resistor 15 having the same resistance R is connected between the gates of the MOSFETs M14 and M16. The gates of the MOSFETs M15 and M16, which are input ends of the second transistor pair, are coupled together. Therefore, the differential input voltage $V_i$ is divided by two by the resistors 14 and 15 to be applied to the coupled gates of the MOSFETs M15 and M16. In other words, the coupled gates of the MOSFETs M15 and M16 are applied with a dc voltage of $(V_i/2)$ contained in the differential input voltage $V_i$.

Output ends of the first transistor pair, i.e., drains of the MOSFETs M13 and M14 are coupled together, through which an output current $I_L$ of the quadritail circuit 2 is derived. Output ends of the second transistor pair, i.e., drains of the MOSFETs M15 and M16 are coupled together to be applied with a supply voltage $V_{DD}$.

There are a current mirror circuit 12 formed of two N-channel MOSFETs M17 and M18 and a constant voltage source 13 supplying a constant dc voltage $V_{LS}$ between the differential pair 1 and the quadritail circuit 2.

In the current mirror circuit 12, gates of the MOSFETs M17 and M18 are coupled together. Sources of the MOSFETs M17 and M18 are coupled together to be connected to a positive-side end of the voltage source 13. The gate and drain of the MOSFET M17 are coupled together to be connected to the coupled drains of the MOSFETs M13 and M14.

A negative-side end of the voltage source 13 is connected the coupled sources of the MOSFETs M11 and M12 of the differential pair 1.

The current minor circuit 12 produces a tail current $I_{ss}$ twice as much as the output current $I_L$ of the quadritail circuit 2 that is derived through the coupled drains of the MOSFETs M13 and M14.

The constant voltage source 13 shifts the voltage level between the differential pair 1 and the current mirror circuit 12.

With the MOS OTA according to the first embodiment, a drain current of each MOSFET is expressed as follows in the similar way as the case of the conventional one of FIG. 1.

If drain currents of the MOSFETs M13 and M14 are defined as $I_{D13}$ and $I_{14}$, respectively, they are expressed by the following equations (8) and (9), where $V_{GS13}$ and $V_{GS14}$ are the gate-to-source voltages of the respective MOSFETs M13 and M14.

$$I_{D13} = \beta \left( V_{DS13} + \frac{V_i}{2} - V_{TH} \right)^2 \quad \left( V_{GS13} + \frac{V_i}{2} \geq V_{TH} \right) \tag{8}$$

$$I_{D14} = \beta \left( V_{GS14} - \frac{V_i}{2} - V_{TH} \right)^2 \quad \left( V_{GS14} - \frac{V_i}{2} \geq V_{TH} \right) \tag{9}$$

The output current $I_L$ of the quadritail circuit 2 is expressed as $I_L = I_{D15} - I_{D14}$, and therefore, $I_L$ is given by the following equation (10a), (10b) add (10c) using the equations (8) and (9).

$$I_L = \frac{I_0}{2} - \frac{\beta V_i}{4} \quad \left( |V_i| \leq \sqrt{\frac{2I_0}{3\beta}} \right) \tag{10a}$$

$$I_L = \frac{2}{3} I_0 - \frac{\left( \beta V_i^2 + 2\beta |V_i| \sqrt{2\left(\frac{6I_0}{\beta} - V_i^2\right)} \right)}{18} \tag{10b}$$

$$\left( \sqrt{\frac{2I_0}{3\beta}} \leq |V_i| \leq 2\sqrt{\frac{I_0}{\beta}} \right)$$

$$I_L = 0 \quad \left( |V_i| \geq 2\sqrt{\frac{I_0}{\beta}} \right) \tag{10c}$$

Figure 6:
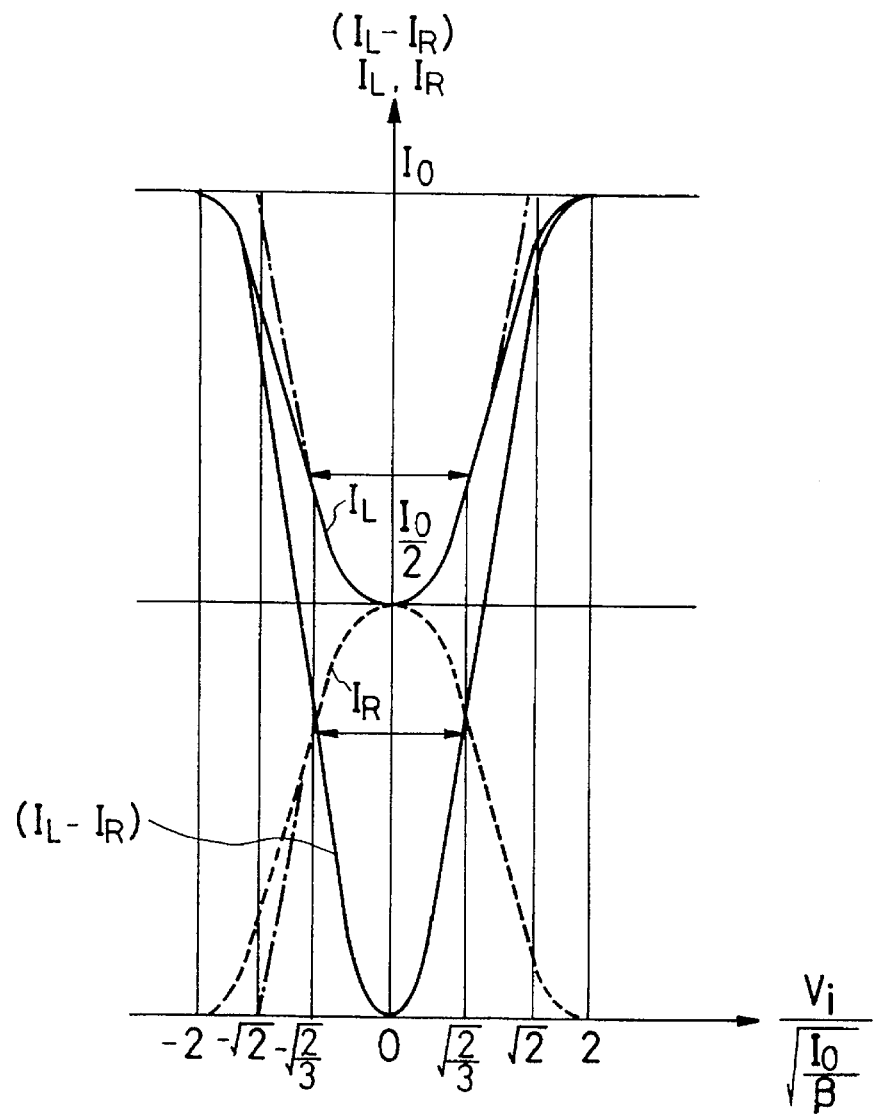
FIG. 6 shows input-output or transfer characteristics of a quadritail circuit used in the MOS OTA of the first embodiment.

FIG. 6 shows the transfer characteristics of the quadritail circuit 2 based on the equations (10a), (10b) and (10c).

It is seen from the equation (10a) that the quadritail circuit 2 has an ideal square-law characteristic within the input voltage range of $|V_i| \leq (2I_0/3\beta)^{1/2}$.

To adaptively bias the differential pair 1, it is seen from the above relationship (3) that the output current $I_L$ should satisfy the following relationship (11).

$$I_{ss} = 2I_0 - 2I_L \tag{11}$$

Under the relationship (11), the transconductance $g_m$ of this MOS OTA becomes constant, i.e., $g_m = (2I_0\beta)^{1/2}$, where $|V_i| \leq (2I_0/3\beta)^{1/2}$.

Here, drain currents of the MOSFETs M11 and M12 are defined as $I_{D11}$ and $I_{D12}$, respectively. Then, a differential output current $\Delta I$ ($=I_{D11}-I_{D12}$) is expressed as the following equations (12a), (12b), (12c) and (12d).

$$\Delta I = \sqrt{2\beta I_0}\ V_i \left( |V_i| \leq \sqrt{\frac{2I_0}{3\beta}}\ \right) \tag{12a}$$

$$\Delta I = \frac{\beta V_i}{3}\sqrt{12\frac{I_0}{\beta} - 7V_i^2 + 4|V_i|\sqrt{2\left(\frac{6I_0}{\beta} - V_i^2\right)}}$$

$$\left(\sqrt{\frac{2I_0}{3\beta}} \leq |V_i| \leq \sqrt{\left(1 + \frac{1}{\sqrt{2}}\right)\frac{I_0}{\beta}}\right) \tag{12b}$$

$$\Delta I = \frac{\left(\beta V_i^2 + 6I_0 + 2\beta|V_i|\sqrt{2\left(\frac{6I_0}{\beta} - V_i^2\right)}\right)}{9}$$

$$\left(\sqrt{\left(1 + \frac{1}{\sqrt{2}}\right)\frac{I_0}{\beta}} \leq |V_i| \leq \sqrt{\frac{I}{\beta}}\right) \tag{12c}$$

$$\Delta I = 2I_0\,\mathrm{sgn}(V_i)\left(|V_i| \geq 2\sqrt{\frac{I_0}{\beta}}\right) \tag{12d}$$

Figure 8:
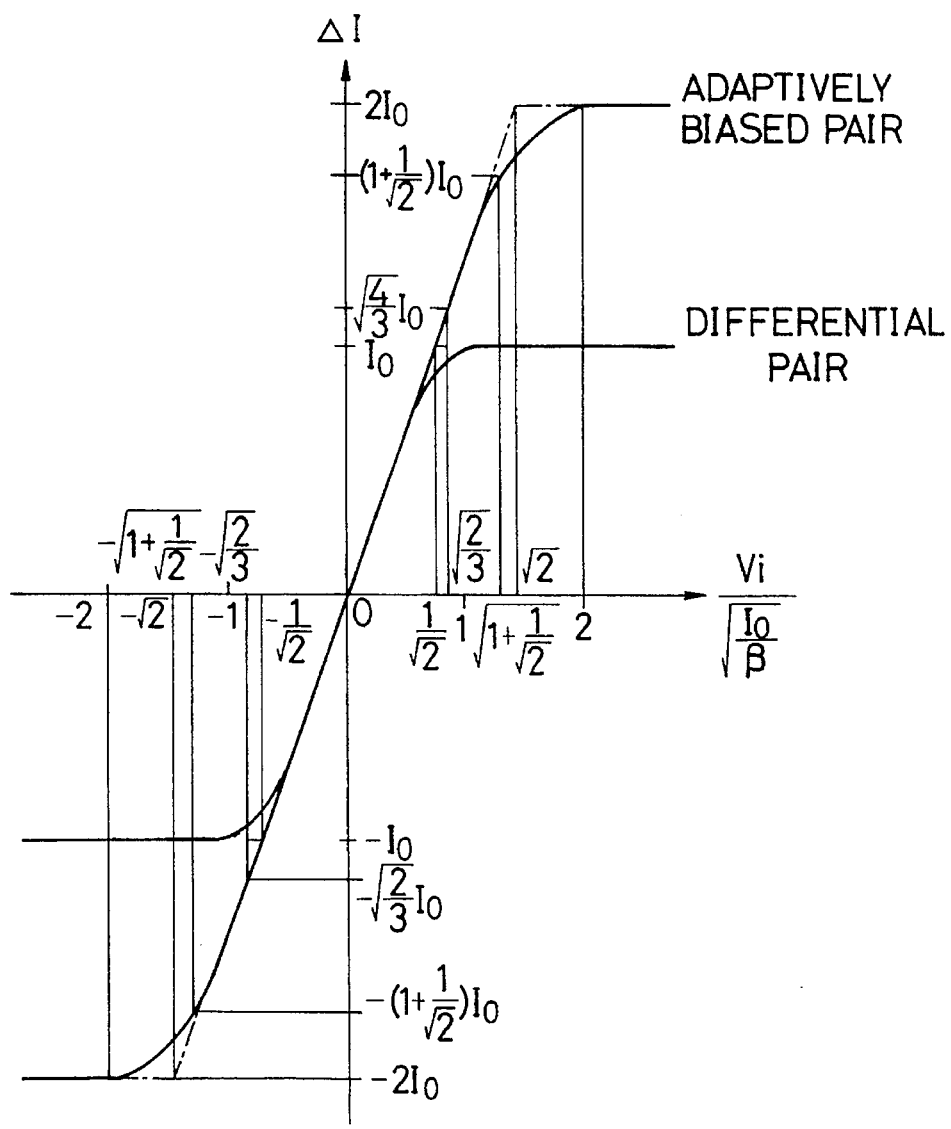
FIG. 8 shows input-output or transfer characteristics of the MOS OTA of the first embodiment and a source-coupled differential pair with a constant tail current.

FIG. 8 shows the input-output or transfer characteristic of the MOS OTA of the first embodiment, in which the transfer characteristic of a conventional differential pair of MOSFETs driven by a constant current is also shown. It is seen from FIG. 8 that the MOS OTA of the first embodiment has a wider input voltage range for superior linearity than that of the conventional differential pair.

Figure 9:
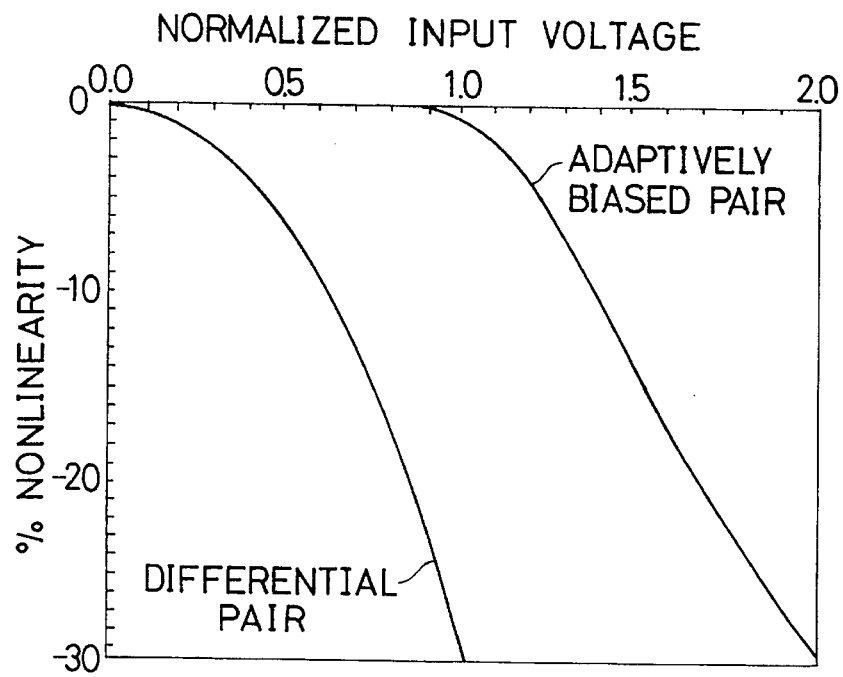
FIG. 9 shows the transconductance nonlinearity characteristics of the MOS OTA of the first embodiment and a source-coupled differential pair with a constant tail current as a function of the normalized input voltage.

FIG. 9 shows the relationships of nonlinearity of transfer characteristic of the MOS OTA of the first embodiment and the conventional differential pair of MOSFETs driven by a constant current. It is seen from FIG. 9 that superior linearity of the transfer characteristic can be obtained in the wider input voltage range than that of the conventional differential pair.

The transconductance of the MOS OTA of the first embodiment is obtained by differentiating the differential output current $\Delta I$ by the differential input voltage $V_i$ as the following equations (13a), (13b), (13c) and (13d).

$$\frac{d(\Delta I)}{dV_i} = \sqrt{2\beta I_0}\ \left(|V_i| \leq \sqrt{\frac{2I_0}{3\beta}}\ \right) \tag{13a}$$

$$\frac{d(\Delta I)}{dV_1} = \frac{\beta}{3}\sqrt{12\frac{I_0}{\beta} - 7V_i^2 + 4|V_i|\sqrt{2\left(\frac{6I_0}{\beta} - V_i^2\right)}}\ +$$

$$\frac{\beta}{3}V_i\left\{-7V_i + 2\mathrm{sgn}(V_i)\sqrt{2\left(\frac{6I_0}{\beta} - V_i^2\right)} - \frac{4\beta|V_i|V_i}{\sqrt{2\left(\frac{6I_0}{\beta} - V_i^2\right)}}\right\} \times$$

$$\frac{1}{\sqrt{\frac{12I_0}{\beta} - 7V_i^2 + 4|V_i|\sqrt{2\left(\frac{6I_0}{\beta} - V_i^2\right)}}}\left(\sqrt{\frac{2I_0}{3\beta}} \leq |V_i| \leq \sqrt{\left(1 + \frac{1}{\sqrt{2}}\right)\frac{I_0}{\beta}}\right) \tag{13b}$$

$$\frac{d(\Delta I)}{dV_i} = \frac{2\beta}{9}\left\{V_i + \mathrm{sgn}(V_i)\sqrt{2\left(\frac{6I_0}{\beta} - V_i^2\right)} - \frac{2\beta|V_i|V_i}{\sqrt{2\left(\frac{6I_0}{\beta} - V_i^2\right)}}\right\}\left(\sqrt{\left(1 + \frac{1}{\sqrt{2}}\right)\frac{I_0}{\beta}} \leq |V_i| \leq 2\sqrt{\frac{I_0}{\beta}}\right) \tag{13c}$$

$$\frac{d(\Delta I)}{dV_i} = 0\ \left(|V_i| \geq 2\sqrt{\frac{I_0}{\beta}}\right) \tag{13d}$$

Figure 10:
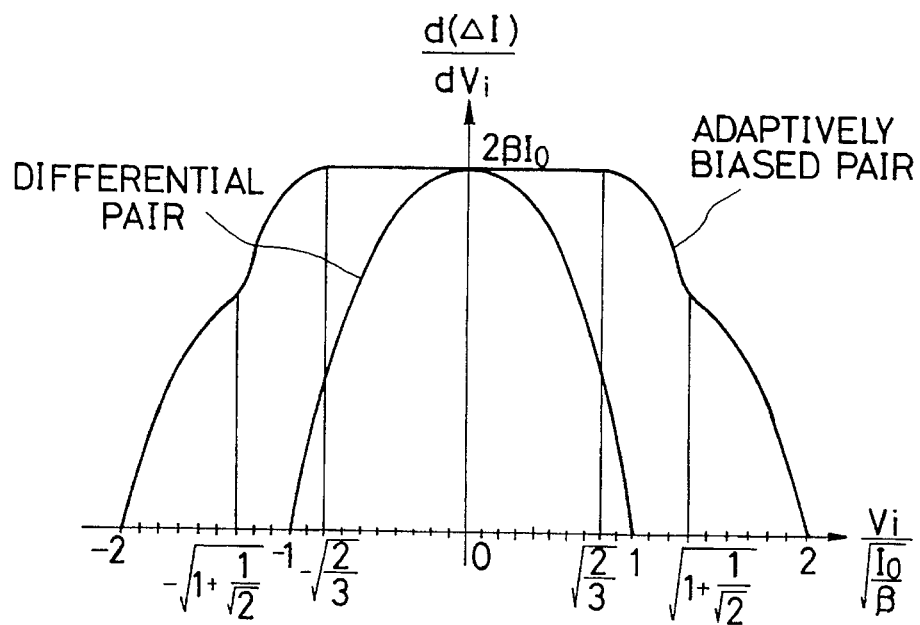
FIG. 10 shows transconductance characteristics of the MOS OTA of the first embodiment and a source-coupled differential pair with a constant tail current.

FIG. 10 shows the transconductance characteristics of the MOS OTA of the first embodiment and the conventional, unbiased differential pair of MOSFETs driven by a constant current. It is seen from FIG. 10 that the input voltage range for superior transconductance linearity is considerably wider than that of the conventional differential pair.

SECOND EMBODIMENT

Figure 7:
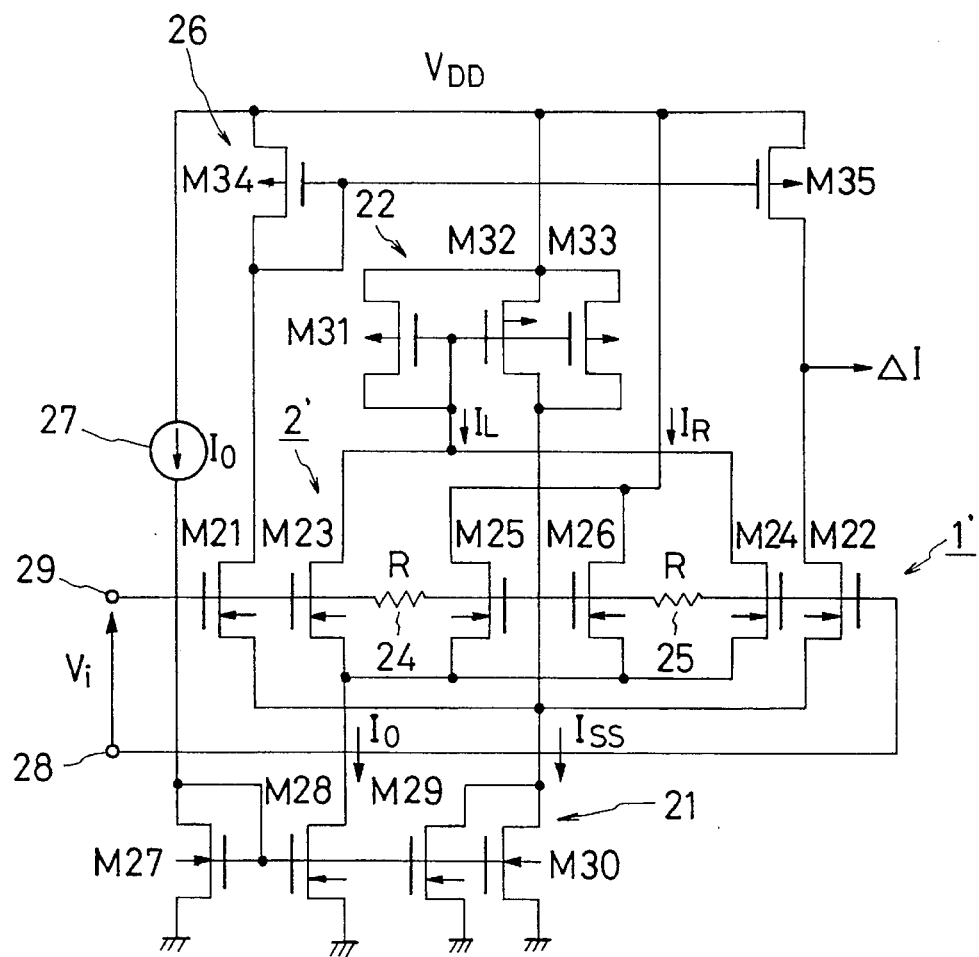
FIG. 7 is a circuit diagram of an adaptively-biased MOS OTA according to a second embodiment of the present invention.

FIG. 7 shows an adaptively biased MOS OTA according to a second embodiment of the invention.

As shown in FIG. 7, a MOS OTA according to the second embodiment contains a balanced differential pair 1' formed of P-channel MOSFETs M21 and M22, and a quadritail circuit 2' formed of four P-channel MOSFETs M23, M24, M25 and M26 and a single constant current sink 21 (current: $I_0$) for driving the quadritail circuit 2'. The quadritail circuit 2' drives the differential pair 1' by its output current.

The MOSFETs M21 and M22 of the differential pair 1' have gate-width to gate-length ratios (W/L) equal to each other. Input ends of the differential pair 1', i.e., gates of the MOSFETs M21 and M12 are connected to a pair of input terminals 28 and 29 through which a differential input voltage $V_i$ is applied.

The MOSFETs M23 and M24 of the quadritail circuit 2' form a first balanced transistor pair, and the MOSFETs M25 and M26 thereof form a second balanced transistor pair. Here, the MOSFETs M23, M24, M25 and M26 have gate-width to gate-length ratios (W/L) equal to each other.

Sources of the MOSFETs M23, M24, M25 and M26 are coupled together to be connected to the constant current sink 21. Drains of the MOSFETs M23 and M24 are coupled together. Drains of the MOSFETs M25 and M26 are also coupled together.

Input ends of the first transistor pair, i.e., gates of the MOSFETs M23 and M24 are connected to the pair of input terminals 29 and 28, respectively. Therefore, the gates of the MOSFETs M23 and M24 are applied with the differential input voltage $V_i$.

A resistor 25 having a resistance R is connected between the gates of the MOSFETs M23 and M25. Another resistor 25 having the same resistance R is connected between the gates of the MOSFETs M24 and M26. The gates of the MOSFETs M25 and M26, which are input ends of the second transistor pair, are coupled together. Therefore, the differential input voltage $V_i$ is divided by two by the resistors 24 and 25 to be applied to the coupled gates of the MOSFETs M25 and M26. In other words, the coupled gates of the MOSFETs M25 and M26 are applied with a voltage of $(V_i/2)$.

Output ends of the first transistor pair, i.e., drains of the MOSFETs M23 and M24 are coupled together, through which an output current $I_L$ of the quadritail circuit 2' is derived. Output ends of the second transistor pair, i.e., drains of the MOSFETs M25 and M26 are coupled together to be applied with a supply voltage $V_{DD}$.

There is a current mirror circuit 22 formed of three N-channel MOSFETs M31, M32 and M33 adjacent to the quadritail circuit 2'.

In the current mirror circuit 22, gates of the MOSFETs M31, M32 and M33 are coupled together. Sources of the MOSFETs M31, M32, and M33 are coupled together to be applied with a supply voltage $V_{DD}$. The gate and a drain of the MOSFET M31 are coupled together to be connected to the coupled drains of the MOSFETs M23 and M24. Drains of the MOSFETs M32 and M33 are coupled together.

The current mirror circuit 22 acts as a constant current sink that produces a tail current $I_{ss}$ twice as much as the output current $I_L$ of the quadritail circuit 2' that is derived through the coupled drains of the MOSFETs M23 and M24.

A current mirror circuit 21, which is formed of four P-channel MOSFETs M27, M28, M29 and M30, acts as a constant current sink that produces the driving current (current; $I_0$) for the quadritail circuit 2' and the tail current $I_{ss}$ for the differential pair 1' due to a constant current sink 27 (current: $I_0$).

In the current mirror circuit 21, gates of the MOSFETs M27, M28, M29 and M30 are coupled together. Sources of the MOSFETs M27, M28, M29 and M30 are grounded. The gate and drain of the MOSFET M27 are coupled together to be connected to the constant current sink 27. The drain of the MOSFET M28 is connected to the coupled sources of the MOSFETs M23, M24, M25 and M26. The gate and a drain of the MOSFETs M29 and M30 are coupled together to be connected to the coupled sources of the MOSFETs M21 and M22.

A current mirror circuit 26, which is formed of two N-channel MOSFETs M34 and M35, acts as an active load of the differential pair 1'.

In the current mirror circuit 26, gates of the MOSFETs M34 and M35 are coupled together. Sources of the MOSFETs M34 and M35 are applied to the supply voltage $V_{DD}$. The gate and drain of the MOSFET M34 are coupled together to be connected to the drain of the MOSFET M21. The drain of the MOSFET M35 is connected to the drain of the MOSFET M22.

With the MOS OTA according to the second embodiment, since the differential pair 1' and the quadritail circuit 2' are the same in configuration as those of the first embodiment, a differential output current ΔI of the MOS OTA of the second embodiment is expressed as the above equations (12a), (12b), (12c) and (12d) and a transconductance thereof is expressed as the above equations (13a), (13b), (13c) and (13d).

As a result, the same effects or advantages as those of the first embodiment cain be obtained.

With the MOS OTA according to the second embodiment, since the constant voltage source 13 that is difficult to be fabricated on a semiconductor integrated circuit device is not necessary, there is an additional advantage that the MOS OTA can be more readily realized on the semiconductor integrated circuit device than the case of the first embodiment.

Although the resistor pairs 14 and 15 of the first embodiment and 24 and 25 of the second embodiment are described as having the same resistance the values of the resistors may be different from each other. It is sufficient for the invention that the gates of the MOSFETs M15 and M16 or M25 and M26 of the second transistor pair forming the quadritail circuit 2 or 2' are applied with any dc voltage of the differential input voltage $V_i$.

while the preferred-forms of the present invention have been described, it is to be understood that modifications will be apparent to those skilled in the art without departing from the spirit of the invention. The scope of the invention, therefore, is to be determined solely by the following claims.

What is claimed is:

1. A MOS operational transconductance amplifier comprising:

(a) a differential pair of first and second MOSFETs whose sources are coupled together, said differential pair being driven by its tail current;

(b) a quadritail circuit whose output current has a square-law characteristic;

(c) a first current adjusting circuit for producing a first relationship between said tail current of said differential pair and said output current of said quadritail circuit;

(d) a constant current source or sink;

(e) said quadritail circuit comprising a first transistor pair of third and fourth MOSFETs, a second transistor pair of fifth and sixth MOSFETs, said quadritail circuit driven by a quadritail driving current;

sources of said third, fourth, fifth and sixth MOSFETs being coupled together to be driven by said quadritail driving current;

drains of said third and fourth MOSFETs of said first transistor pair being coupled together;

drains of said fifth and sixth MOSFETs of said second transistor pair being coupled together;

said output current of said quadritail circuit being derived from one of said coupled drains of said third and fourth MOSFETs and said coupled drains of said fifth and sixth MOSFETs;

gates of said third and fourth MOSFETs being applied with a differential input signal; and gates of said fifth and sixth MOSFETs being coupled together and applied with a voltage divided component of said differential input signal;

(f) a second current adjusting circuit for producing a second relationship between the current produced by said constant current source or sink and said quadritail driving current; said second current adjusting circuit also producing a third relationship between said current produced by said constant current source or sink and said tail current of said differential pair;

(g) said differential input signal being applied across gates of said first and second MOSFETs;

(h) a differential output signal being derived from drains of said first and second MOSFETs; and (i) a transconductance nonlinearity of said differential pair being compensated by said output signal of said quadritail circuit.

2. An amplifier as claimed in claim 1, wherein gate length to gate width ratios of said first, second, third, fourth, fifth, and sixth MOSFETs are equal.

3. An amplifier as claimed in claim 1, further comprising a first resistor and a second resistor, said first resistor being connected between said gates of said third and fifth MOSFETs and said second resistor being connected between said gates of said fourth and sixth MOSFETs.

4. An amplifier as claimed in claim 3, wherein resistances of said first resistor and said second resistor are equal to each other.

5. An amplifier as claimed in claim 1, wherein said first current adjusting circuit is a current mirror circuit.

6. An amplifier as claimed in claim 5, wherein said first relationship between said tail current of said differential pair and said output current of said quadritail circuit is about 2 to 1.

7. An amplifier as claimed in claim 5, wherein said second current adjusting circuit is a current mirror circuit.

8. An amplifier as claimed in claim 7, wherein said second relationship between the current produced by said constant current source or sink and said quadritail driving current is about 1 to 1.

9. An amplifier as claimed in claim 7, wherein said third relationship between said tail current of said differential pair and said current produced by said constant current source or sink is about 2 to 1.

* * * * *